United States Patent
Tessa Contin et al.

(10) Patent No.: US 7,023,047 B2
(45) Date of Patent: Apr. 4, 2006

(54) MOS DEVICE AND PROCESS FOR MANUFACTURING MOS DEVICES USING DUAL-POLYSILICON LAYER TECHNOLOGY

(75) Inventors: Valentina Tessa Contin, Milan (IT); Carlo Caimi, Cinisello Balsamo (IT); Davide Merlani, Monza (IT); Paolo Caprara, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/745,295

(22) Filed: Dec. 23, 2003

(65) Prior Publication Data

US 2004/0188759 A1 Sep. 30, 2004

(30) Foreign Application Priority Data

Dec. 24, 2002 (IT) .......................... TO2002A1119

(51) Int. Cl.
*H01L 29/72* (2006.01)

(52) U.S. Cl. ...................... 257/315; 257/316; 257/321; 257/365; 257/377; 438/257; 438/258; 438/266

(58) Field of Classification Search ................ 257/377, 257/385, 296, 315–316, 321, 392, 365, 381, 257/774, 756, 773; 438/257–258, 266
See application file for complete search history.

(56) References Cited

U.S. PATENT DOCUMENTS

| | | | |
|---|---|---|---|
| 4,719,184 A | 1/1988 | Cantarelli et al. | 437/24 |
| 5,326,999 A | 7/1994 | Kim et al. | 275/315 |
| 5,851,880 A * | 12/1998 | Ikegami | 438/258 |
| 6,387,745 B1 | 5/2002 | Onoda et al. | 438/237 |
| 6,548,857 B1 | 4/2003 | Dalla Libera et al. | 257/315 |
| 6,680,514 B1 * | 1/2004 | Geffken et al. | 257/368 |
| 2002/0127802 A1 | 9/2002 | Goda et al. | 438/257 |

FOREIGN PATENT DOCUMENTS

EP 0 996 162 A1 4/2000

OTHER PUBLICATIONS

U.S. Appl. No. 10/745,297, filed Dec. 23, 2003, Caimi et al.

* cited by examiner

*Primary Examiner*—Donghee Kang
(74) *Attorney, Agent, or Firm*—Lisa K. Jorgenson; Hai Han; Seed IP Law Group PLLC

(57) ABSTRACT

An MOS device has a stack and a passivation layer covering the stack. The stack is formed by a first polysilicon region and by a second polysilicon region arranged on top of one another and separated by an intermediate dielectric region. An electrical connection region, formed by a column structure substantially free of steps, extends through the passivation layer, the second polysilicon region and the intermediate dielectric region, and terminates in contact with the first polysilicon region so as to electrically contacting the first polysilicon region and the second polysilicon region. Fabrication of the electrical connection region requires just one mask.

20 Claims, 4 Drawing Sheets

MOS DEVICE AND PROCESS FOR MANUFACTURING MOS DEVICES USING DUAL-POLYSILICON LAYER TECHNOLOGY

CROSS-REFERENCE TO RELATED APPLICATION

This application claims priority to Italian Patent Application No. TO2002A 001119 entitled "MOS DEVICE AND PROCESS FOR MANUFACTURING MOS DEVICES USING DUAL-POLYSILICON LAYER TECHNOLOGY", filed on Dec. 24, 2002, which is incorporated herein by reference in its entirety.

BACKGROUND OF THE INVENTION

1. Field of the Invention

The present invention relates to an MOS device and to a process for manufacturing MOS devices using dual-polysilicon layer technology.

2. Description of the Related Art

As is known, simultaneous fabrication in an integrated device of dual-polysilicon layer memory cells and transistors requires removing the polysilicon layer overlying the dielectric and the intermediate dielectric layer in the circuitry area, where the transistors or the electrical connection are made, or forming an electrical connection between the first and the second polysilicon layers for the individual transistors.

In particular, U.S. Pat. No. 4,719,184, filed in the name of the present applicant, describes a process, referred to as the double-poly-short-circuited (DPCC) process, which enables short-circuiting the first and second polysilicon layers. According to the aforesaid process, after deposition of the first polysilicon layer and of an interpoly dielectric layer, part of the interpoly dielectric layer is removed in the circuitry area, using a purposely designed mask referred to as "matrix mask". This mask enables removal of all of the interpoly dielectric on top of the active area of the transistors, or in preset portions, on top of or outside the active area. In this way, when the second polysilicon layer is deposited, it directly contacts the first polysilicon layer in the areas where the interpoly dielectric has been removed.

According to a further possibility, the electrical connection between the first and second polysilicon layers is obtained by using a connection region, the production of which requires two masking and etching steps. In fact, first it is necessary to remove part of the second polysilicon layer and of the interpoly dielectric layer so as to expose part of the first polysilicon layer, and then to open the vias through the passivation layer, for forming the connection region.

The above solution is represented in FIGS. 1 and 2, which illustrate, respectively, a top view and a cross-section of a MOS transistor obtained using the process described. In FIGS. 1 and 2, a body 1, of semiconductor material, has an insulation region 2 surrounding an active area 3 (FIG. 1). A stack 4 extends on top of the body 1 and comprises (FIG. 2): a gate oxide region 5; a poly1 region 6; an interpoly dielectric region 7; a poly2 region 8; and a silicide region 9. Spacing regions 10 are formed at the sides of the stack 4, and a passivation layer 11 extends on top of the body 1. A plug 12 extends through the passivation layer 11 as far as the stack 4.

FIG. 1 moreover illustrates the shape of the mask for forming the first hole, which has an opening 15 that allows the removal of a portion of the silicide region 9, the poly2 region 8, and the interpoly region 7. Thus, these regions have a width smaller than the poly1 region 6, as may be seen in the cross-section of FIG. 2. FIG. 1 moreover illustrates the contact mask which has, inter alia, an opening 12a for the plug 12, which is staggered with respect to the opening 15, and in particular is arranged on top of both the remaining portions of the silicide region 9 and the poly2 region 8 and on top of the portion of the poly1 region 6 not overlaid by the silicide region 9 and the poly2 region 8 to ensure that the plug 12 to be electrically connected by the plug 12. The plug 12 thus has a step at the silicide layer 9 and, in its bottom part, alongside the regions 7 to 9, has a cross-sectional area much smaller than that of the top part (on top of the stack 4).

Both for the solution just described and for the solution described in U.S. Pat. No. 4,719,184, it is disadvantageous that two masks are necessary for electrically connecting poly1 and poly2, and hence the costs of fabrication are high.

BRIEF SUMMARY OF THE INVENTION

One aim of the present invention is to provide a manufacturing process which does not require specially designed masks for contacting the two polysilicon layers in the circuitry transistors built using dual polysilicon layer technology.

According to the present invention, there are provided a MOS device and a process for manufacturing MOS devices, as defined in claims 1 and 9, respectively.

BRIEF DESCRIPTION OF THE SEVERAL VIEWS OF THE DRAWINGS

For a better understanding of the invention, an embodiment thereof is now described, purely by way of non-limiting example, with reference to the attached drawings, wherein.

DETAILED DESCRIPTION OF THE INVENTION

According to an embodiment of the invention, for electrical connection of the polysilicon layers, just one mask is used, and precisely the mask already used for opening the contacts, as described with reference to FIGS. 3 to 9.

In detail, a manufacturing process of self-aligned type is described herein, comprising initially standard manufacturing steps, which include: defining the active areas, to form field insulation regions, for example using the shallow-trench technique; depositing a gate oxide layer; depositing a first polycrystalline silicon layer (poly1 layer); depositing an interpoly dielectric layer; depositing a second polycrystalline silicon layer (poly2 layer); depositing a silicide layer; and defining the gate stack, with selective removal of portions of the silicide layer, poly2 layer, interpoly dielectric layer, poly1 layer, and gate oxide layer. In the process described, an LDD (low-doped drain) implant is performed, and spacers are formed on the sides of the gate stack. Next, the source and drain regions are implanted.

Figure 4:
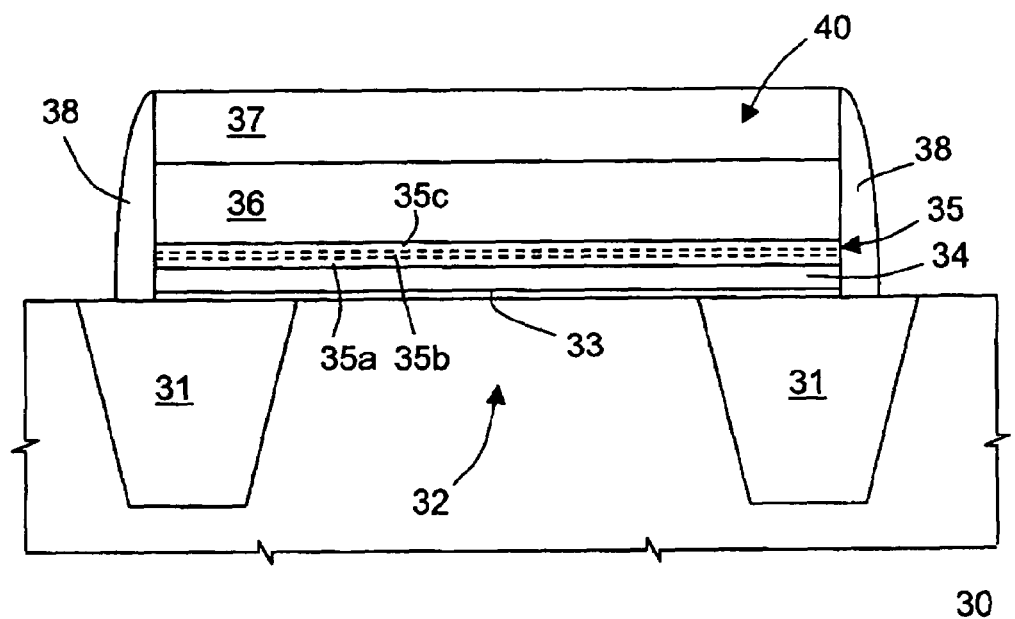
FIGS. 4 to 9 illustrate cross-sectional views, taken along line IX—IX of FIG. 3, in successive manufacturing steps of the transistor of FIG. 3.
Figure 5:
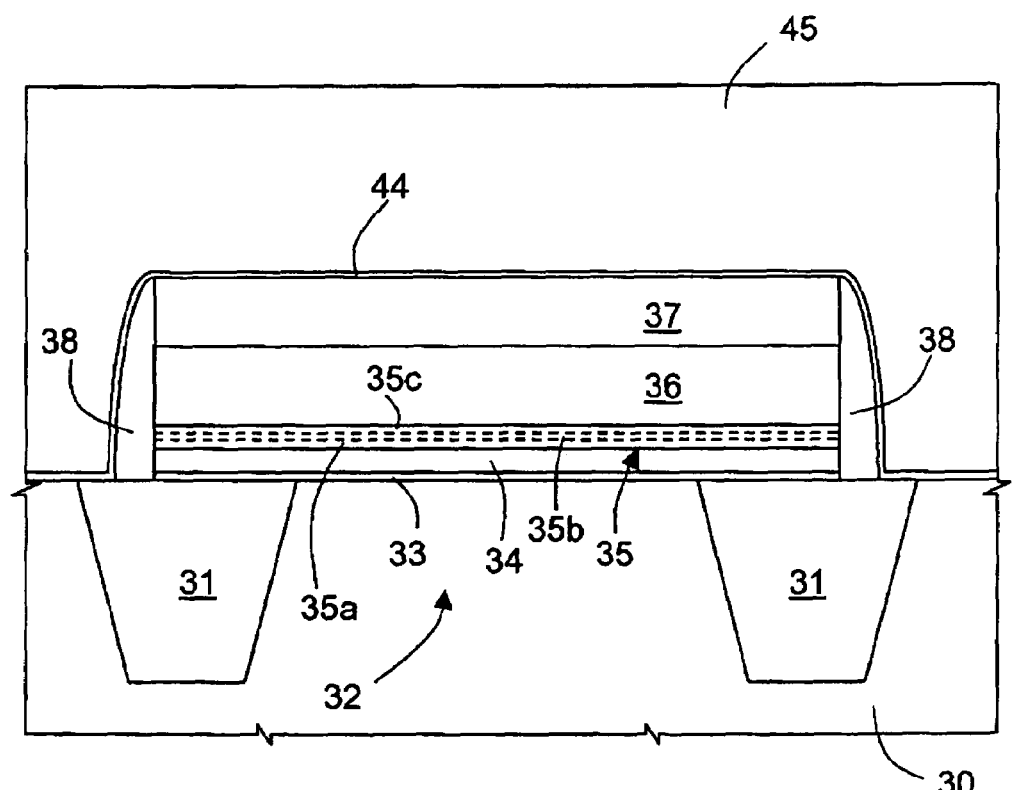

The structure thus obtained is illustrated in FIG. 4 and comprises: a semiconductor body 30; a field insulation region 31 delimiting, inside the semiconductor body 30, an active area 32; and a stack 40, extending on top and at the sides of the active area 32 and on top of the field insulation region 31.

The stack 40 comprises: a gate oxide region 33; a poly1 region 34, arranged on top of the gate oxide region 33; an interpoly dielectric region 35, arranged on top of the poly1 region 34 and formed by a triple ONO (oxide-nitride-oxide) layer, the triple ONO layer including a first oxide layer 35a, a nitride layer 35b, and a second oxide layer 35c; a poly2 region 36, arranged on top of the interpoly dielectric region 35; and a silicide region 37, for example of tungsten silicide, arranged on top of the poly2 region 36. Spacing regions 38, for example of oxide and/or nitride, extend at the sides of the stack 40.

Figure 3:
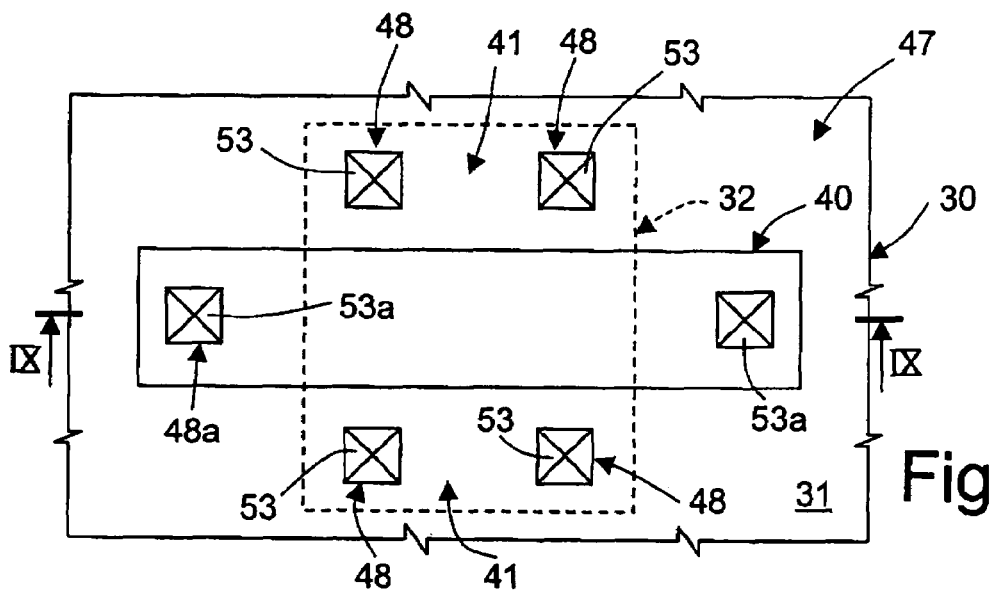
FIG. 3 illustrates the layout of a first embodiment of the transistor according to the invention.

As is evident from FIG. 3, the stack 40 has an elongated shape extending transverse to the active area 32; in particular, the stack 40 has a central portion extending on top of the active area 32 and end portions extending on top of the field insulation region 31.

On the sides of the stack 40, inside the active area 32, the source and drain regions 41 are formed, which are illustrated schematically in FIG. 3.

Next (see FIG. 5), an etch-stop layer 44 is deposited, for instance of nitride, completely coating the stack 40 (and hence the silicide region 37 and the spacing regions 38). Subsequently, a passivation layer 45 of dielectric material, for example oxide, is deposited.

Figure 6:
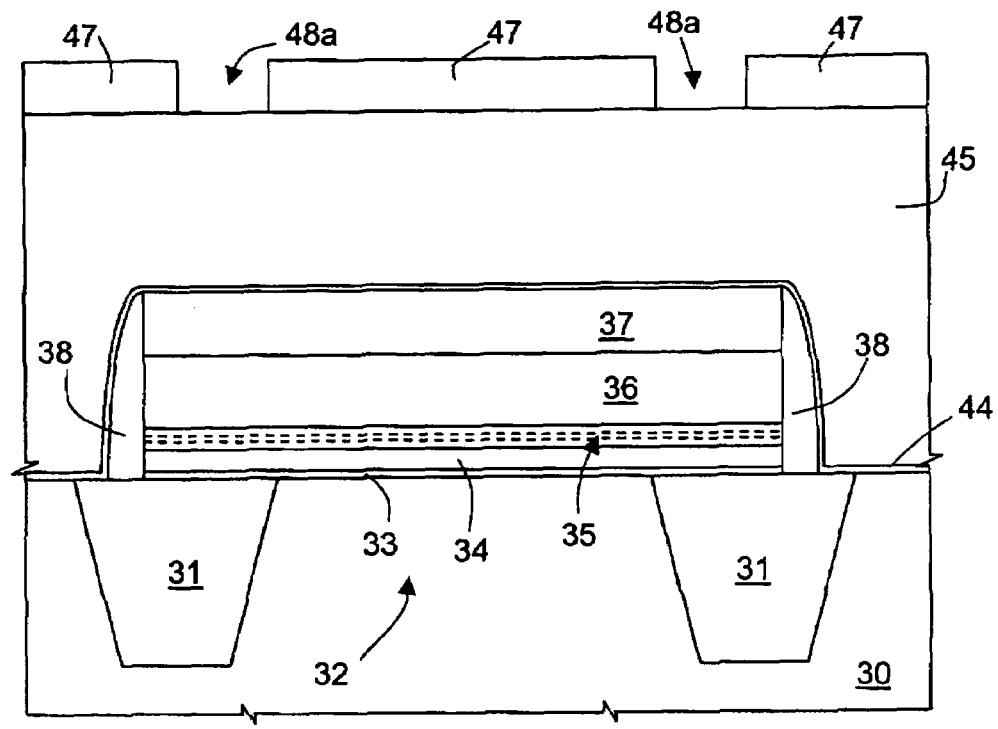

Next, the contact mask is formed, and the contacts are opened. To this end, a photoresist layer is deposited and defined, so as to have openings where the contacts are to be formed, as illustrated in FIGS. 3 and 6, showing the resist mask 47 and the contact openings 48. In particular, the openings for connecting the poly1 region 34 to the poly2 region 36 are designated by 48a. As may be noted, the openings 48a are formed on top of the field insulation region 31, outside the active area 32.

Figure 7:
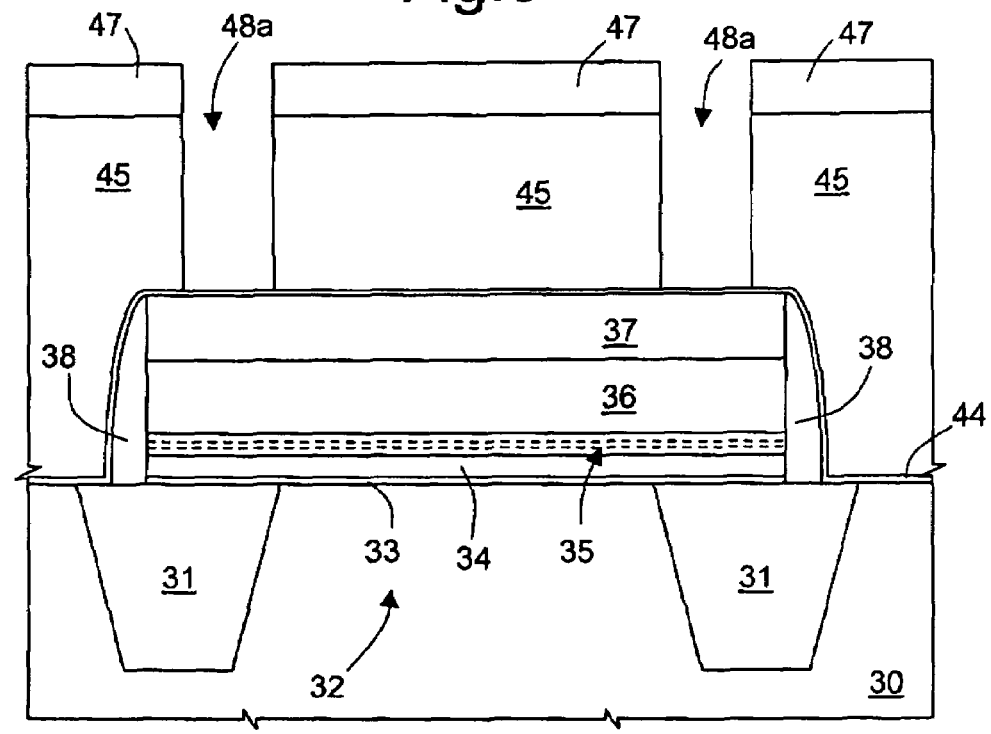
Figure 8:
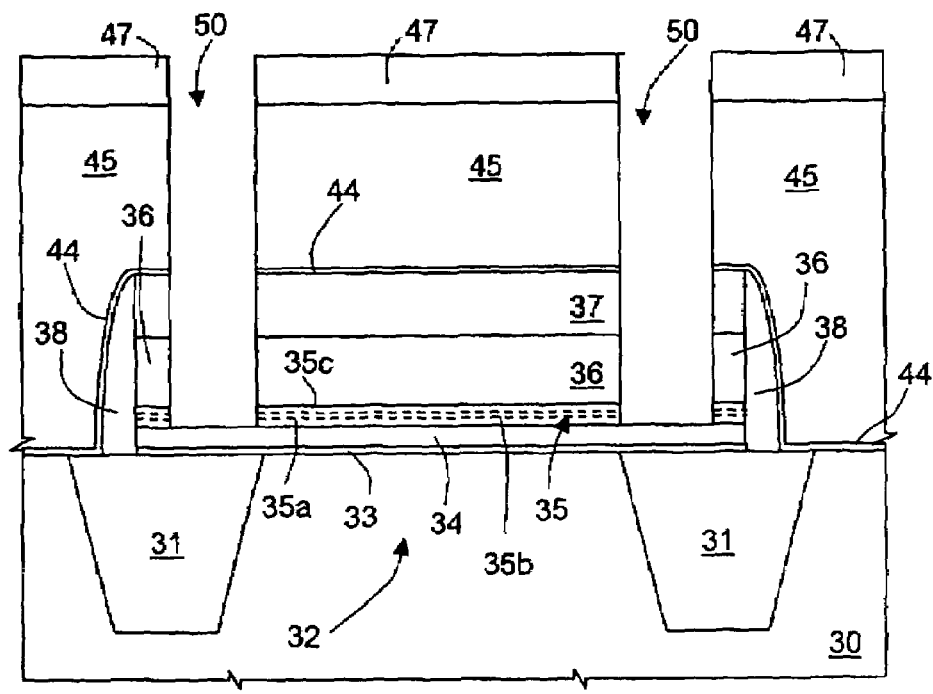

Using the resist mask 47, the passivation layer 45 is initially etched employing a dedicated chemical process that is highly selective in respect to nitride. Said etch stops on the etch-stop layer 44 on top of the stack 40. Elsewhere, and hence also at the contacts on the active area, a passivation thickness equal to the height of the gate stack remains. The structure of FIG. 7 is thus obtained.

Then (see FIG. 8), a second etch is carried out, using once again the resist mask 47 but with different chemical processes so as to remove, in sequence, the etch-stop nitride layer 44 on top of the stack 40, portions of the silicide layer 37, of the poly2 layer 36 and of the interpoly dielectric layer 35, stopping on the poly1 layer 34. Thereby, at the stack 40, paths 50 are formed that extend from the surface of the passivation layer 45 as far as the poly1 layer 34. The residual portion of the passivation layer 45 on top of the contact opening region in the active area (source and drain), is removed by the etch used for the second oxide layer 35c of the interpoly dielectric 35. Subsequently, the etch-stop nitride layer 44 is removed at the contacts, simultaneously with the nitride layer 35b of the interpoly dielectric 35, thus uncovering silicon for source and drain contacts.

Next (FIG. 9), a barrier layer 51, for example of Ti/TiN, and a metal layer 52, for example of tungsten, are deposited in succession. The metal layer 52 fills the paths 50 to form, together with the barrier layer 51, first plugs 53 for contacting the various regions of the transistor, and second plugs 53a in the paths 50. The metal layer 52 is then removed from the surface of the passivation layer 45.

Finally, in a known way, a metal layer is deposited to obtain metal connection regions (metal 1); if envisaged, connections are formed at more than one metallization level, and the customary final operations of fabrication are carried out.

Figure 9:
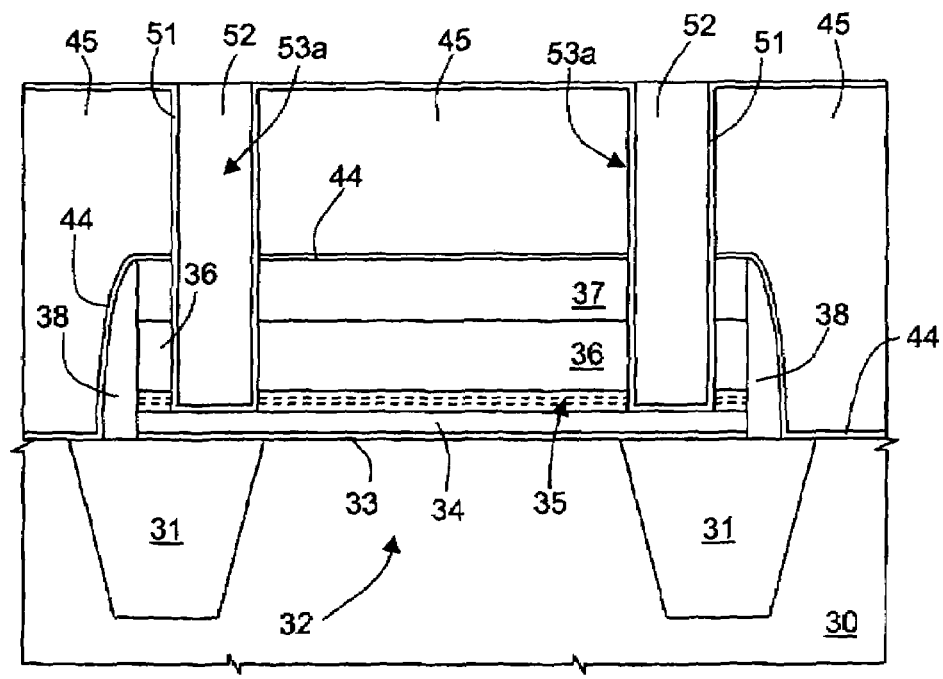

In this way, as may be seen from FIG. 9, the plugs 53a connect the poly1 region 34 and poly2 region 36 by contacting the poly2 region 36 on the sides of the paths 50 and the poly1 region 34 on the bottom of the paths 50.

Figure 1:
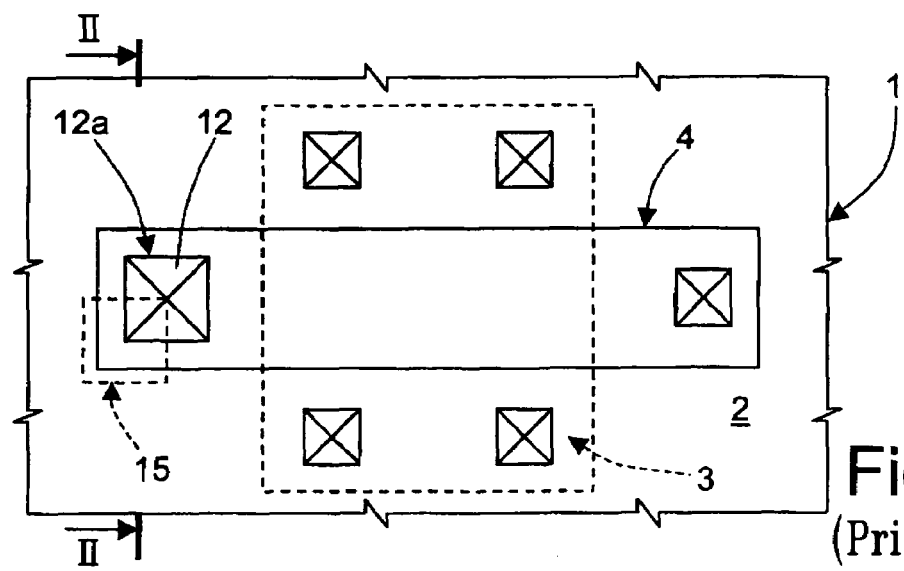
FIG. 1 illustrates the layout of an MOS transistor made with a dedicated mask for connecting the two polysilicon layers.
Figure 2:
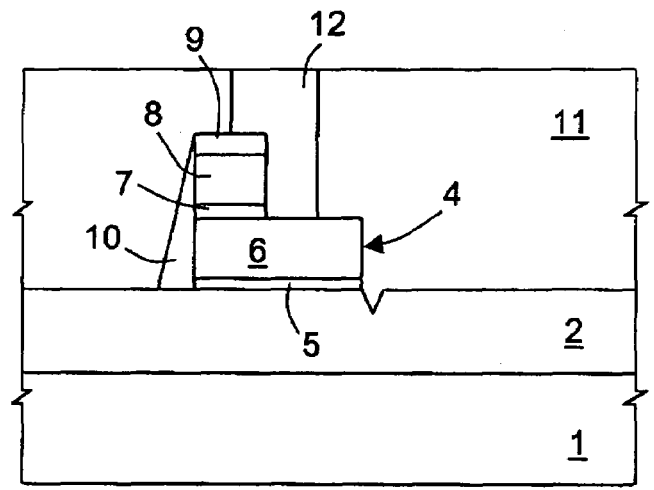
FIG. 2 is a cross-sectional view of the transistor of FIG. 1.

Unlike the plugs 12 of FIG. 2, the plugs 53a are column-like shaped with a substantially constant cross section without any evident steps due to the staggering between the two masks.

The device and the process described herein have the advantages outlined hereinafter.

Connecting the poly1 and poly2 regions through a plug formed in a single opening of the passivation layer 45 and in the stack 40 enables the size of the path 50 to be reduced down to a lithographic minimum, and in particular plugs to be formed of the same size as the plugs used for the active area and for the gate region of the memory cells.

The contact thus obtained can tolerate possible misalignments between the contact mask 47 and the mask for defining the stack 40 as well as any possible process variations. In fact, the second etching step (etching of layers 34–37 and 44) is selective with respect to the oxide and, in the case of misalignment, over-etching of the field insulation region 31 is prevented, provided that the area of the plug 53a lies on top of the stack 40.

A possible partial removal of the poly1 region 34 does not, on the other hand, adversely affect the electrical connection between the regions 34, 36. It follows that the process is reliable and does not present any particular critical aspects.

Elimination of one mask moreover enables saving on a manufacture step which has a far from negligible cost, and hence a reduction in fabrication costs.

Finally, it is evident that modifications and variations may be made to the transistor and to the process described herein, without thereby departing from the scope of the present invention.

For example, the number of poly connection plugs 53a may vary, and poly connection plugs 53a may be provided on both sides of the active area 32. Furthermore, the same solution may be used for electrically connecting two polysilicon layers in other types of devices integrated together with dual-polysilicon-layer memory cells. In addition, the path 50 may be made also on the edge of the stack 40, instead of inside the stack 40.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A MOS device comprising
a passivation layer;
a stack covered by said passivation layer, said stack comprising a first polysilicon region, a second polysilicon region being arranged on top of said first polysilicon region and separated therefrom by an intermediate dielectric region; and
an electrical connection region being in electrical contact with said first and second polysilicon regions, said electrical connection region being formed by a column-shaped structure substantially free of steps and extending through said passivation layer, said second polysilicon region and said intermediate dielectric region and terminating in contact with said first polysilicon region.

2. The MOS device according to claim 1, wherein said electrical connection region has a substantially constant cross-section.

3. The MOS device according to claim 2, wherein said electrical connection region extends along a single path which extends through said passivation layer, said second polysilicon region and said intermediate dielectric region, and terminates on said first polysilicon region.

4. The MOS device according to claim 1, further comprising an etch-stop region of a material highly resistant to etching of said passivation layer on top of said second polysilicon region and covering said stack, said electrical connection region moreover extending through said etch-stop region.

5. The MOS device according to claim 4, wherein said etch-stop region is of silicon nitride, and said passivation layer is of silicon oxide.

6. The MOS device according to claim 5, further comprising a silicide region extending laterally between said second polysilicon region and said etch-stop region, said electrical connection region moreover extending through said silicide region.

7. The MOS device according to claim 1, wherein said stack is a gate region.

8. The MOS device according to claim 7, wherein said gate region has an elongated shape having a central portion extending on top of an active area of a semiconductor material, and end portions extending on top of a field insulation region, wherein said electrical connection region extends on top of said field insulation region.

9. A MOS device comprising
a passivation layer;
a stack covered by said passivation layer, said stack comprising a first conductive region, a second conductive region overlying said first conductive region and being separated therefrom by an intermediate dielectric region; and
an electrical connection structure extending through the passivation layer and in direct contact with said first conductive region, second conductive region and said intermediate dielectric region, said electrical connection structure having a substantially constant peripheral shape throughout the entire length of the electrical connection structure.

10. The MOS device of claim 9 wherein the electrical connection structure extends through said passivation layer, said second conductive region and said intermediate dielectric region and terminates in contact with said first conductive region.

11. The MOS device according to claim 9, further comprising an etch-stop region of a material highly resistant to etching of said passivation layer on top of said second conductive region and covering said stack, said electrical connection region moreover extending through said etch-stop region.

12. The MOS device according to claim 11, wherein said etch-stop region is of silicon nitride, said passivation layer is of silicon oxide and said first and second conductive regions are of polysilicon.

13. The MOS device according to claim 12, further comprising a silicide region extending laterally between said second conductive region and said etch-stop region, said electrical connection region moreover extending through said suicide region.

14. The MOS device according to claim 9, wherein said stack is a gate region of a MOS transistor.

15. A MOS device comprising
a passivation layer;
a stack covered by said passivation layer, said stack comprising a first conductive region, a second conductive region overlying said first conductive region and being separated therefrom by an intermediate dielectric region; and
an electrical connection region in direct contact with said first conductive region, second conductive region and said intermediate dielectric region, wherein the electrical connection region is an elongated structure substantially free of steps and is formed using a single mask to from portions of the electrical connection region that extends through the passivation layer, second conductive region and intermediate dielectric layer.

16. The MOS device of claim 15 wherein the electrical connection region terminates in contact with said first conductive region.

17. The MOS device according to claim 15, further comprising an etch-stop region of a material highly resistant to etching of said passivation layer on top of said second conductive region and covering said stack, said electrical connection region moreover extending through said etch-stop region.

18. The MOS device according to claim 17, wherein said etch-stop region is of silicon nitride, said passivation layer is of silicon oxide and said first and second conductive regions are of polysilicon.

19. The MOS device according to claim 17, further comprising a silicide region extending laterally between said second conductive region and said etch-stop region, said electrical connection region moreover extending through said silicide region.

20. The MOS device according to claim 15, wherein said stack is a gate region of a MOS transistor.

* * * * *

UNITED STATES PATENT AND TRADEMARK OFFICE
CERTIFICATE OF CORRECTION

| | |
|---|---|
| PATENT NO. | : 7,023,047 B2 |
| APPLICATION NO. | : 10/745295 |
| DATED | : April 4, 2006 |
| INVENTOR(S) | : Valentina Tessa Contin et al. |

It is certified that error appears in the above-identified patent and that said Letters Patent is hereby corrected as shown below:

Column 6,
Line 20, "said suicide region." should read as --said silicide region.--.

Signed and Sealed this

Sixth Day of February, 2007

JON W. DUDAS
*Director of the United States Patent and Trademark Office*